United States Patent [19]

Auslander et al.

[11] Patent Number: 5,323,012
[45] Date of Patent: Jun. 21, 1994

[54] APPARATUS FOR POSITIONING A STAGE

[75] Inventors: David M. Auslander, Berkeley, Calif.; Akira Fujii, Ibaraki, Japan; Anthony C. Maurer, Batavia, Ill.; Hsuehmin Li, Berkeley; Chingyei Chung, Albany, both of Calif.

[73] Assignee: The Regents of the University of California, Oakland, Calif.

[21] Appl. No.: 747,300

[22] Filed: Aug. 16, 1991

[51] Int. Cl.$^5$ .............................. H01J 37/20
[52] U.S. Cl. ........................ 250/492.2; 250/442.11
[58] Field of Search ............ 250/492.2, 442.11, 440, 250/310; 356/401

[56] References Cited

U.S. PATENT DOCUMENTS

| | | | |
|---|---|---|---|
| 3,569,718 | 3/1971 | Borner | 250/201 |
| 3,648,048 | 3/1972 | Cahan et al. | 250/49.5 |
| 3,684,904 | 8/1972 | Galutva et al. | 250/442.11 |
| 3,745,341 | 7/1973 | Sakitani | 250/49.5 |
| 3,864,564 | 2/1975 | Adkins | 250/201 |
| 4,066,905 | 1/1978 | Dassler et al. | 250/440.1 |
| 4,103,168 | 7/1978 | Sturrock et al. | 250/442 |
| 4,163,168 | 7/1979 | Ishikawa et al. | 310/328 |
| 4,414,749 | 11/1983 | Johannsmeier | 33/180 |
| 4,447,731 | 5/1984 | Kuni et al. | 250/442.11 |
| 4,506,154 | 3/1985 | Scire | 250/442.1 |
| 4,590,380 | 5/1986 | Tamaki | 250/442.11 |
| 4,607,166 | 8/1986 | Tamaki | 250/442.11 |
| 4,818,169 | 4/1989 | Schram et al. | 414/331 |
| 4,891,526 | 1/1990 | Reeds | 250/442.1 |
| 4,893,914 | 1/1990 | Hancock et al. | 350/530 |

OTHER PUBLICATIONS

*Principles of Feedback Control,* vol. 2, §15.3.3, pp. 567–570 (1988) No Month.

Primary Examiner—Paul M. Dzierzynski
Assistant Examiner—Kiet T. Nguyen
Attorney, Agent, or Firm—Heller, Ehrman, White & McAuliffe

[57] ABSTRACT

An apparatus for positioning a stage. A drive system moves the stage over a first range of motion in at least one direction. An actuator is coupled to the stage to produce a linear force to move the stage over a second range of motion. The second range of motion is less than the first range of motion. A sensor measures the stage position, and a controller controls the stage drive system and actuator.

12 Claims, 6 Drawing Sheets

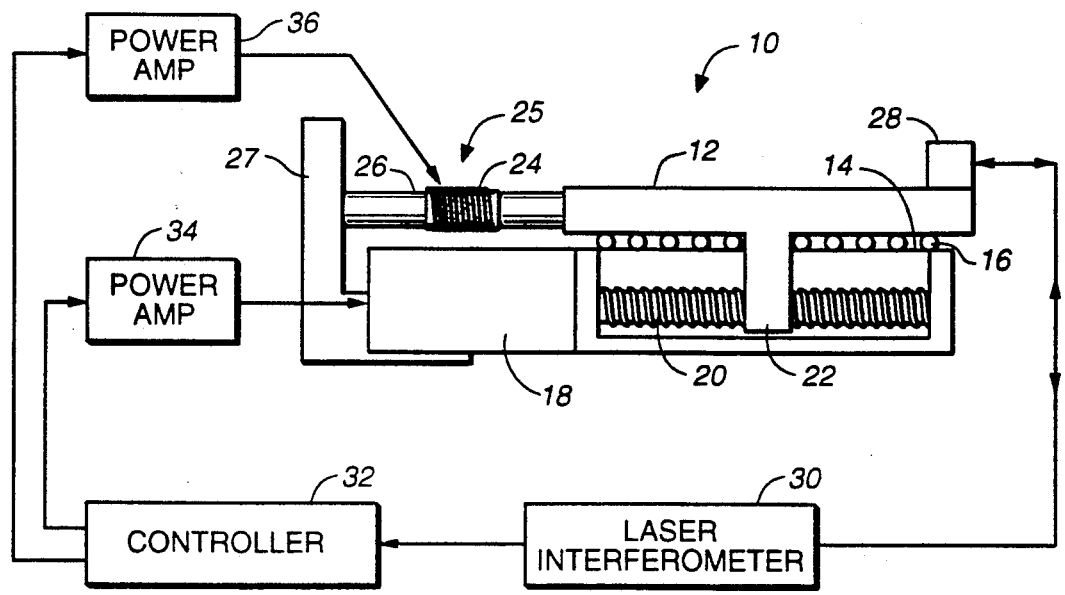
FIG._1
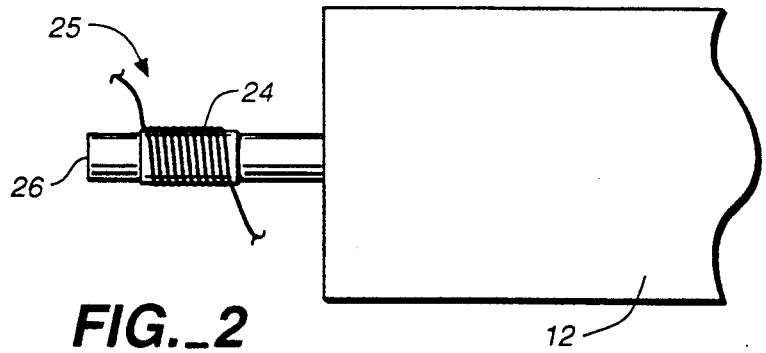
FIG._2
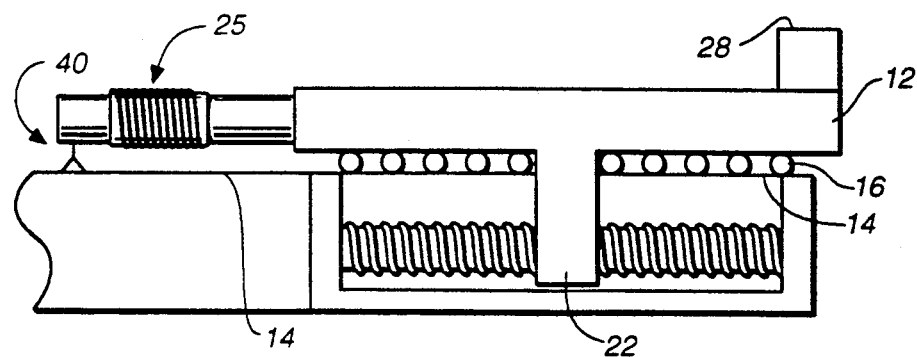
FIG._3A

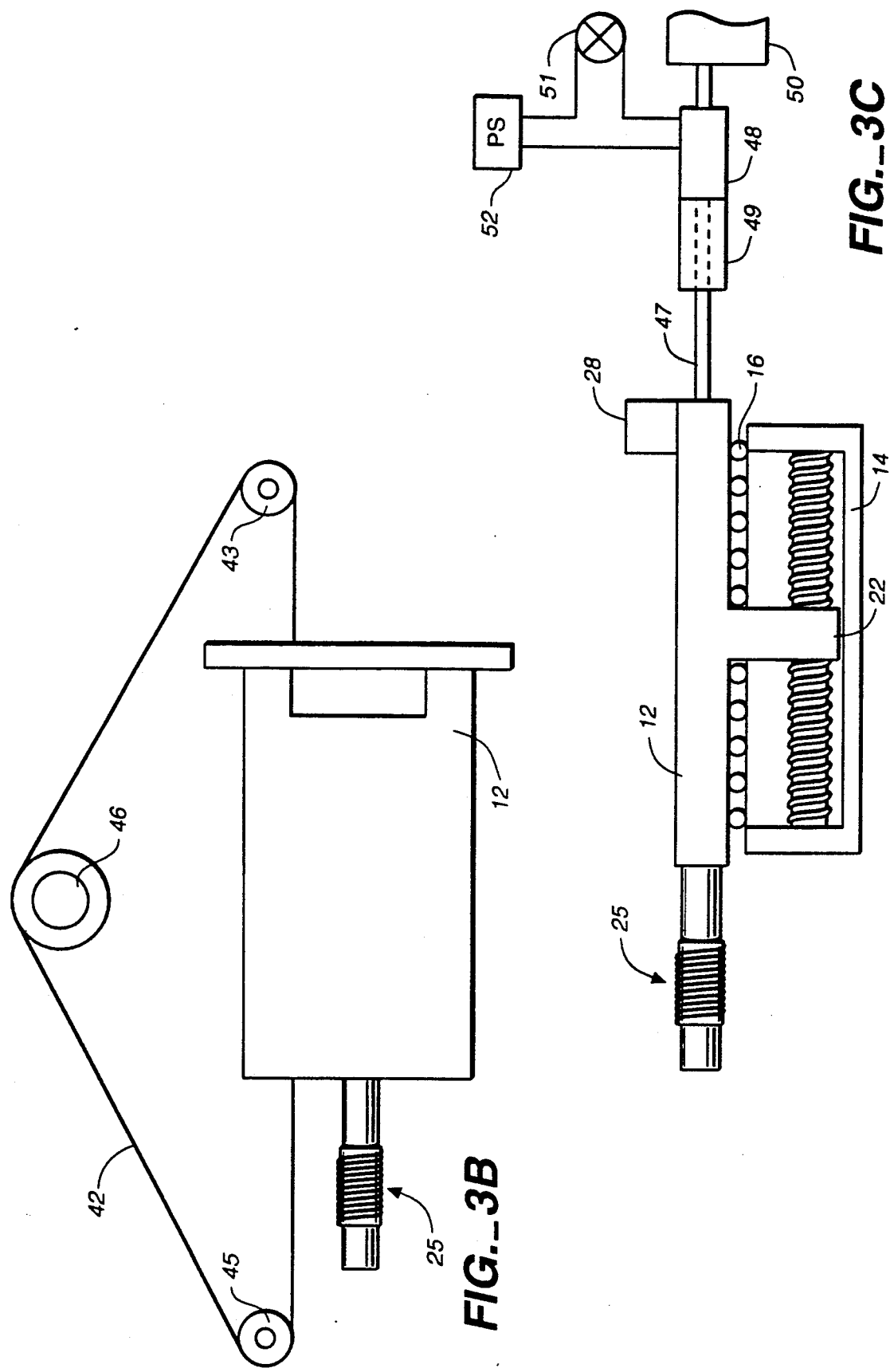

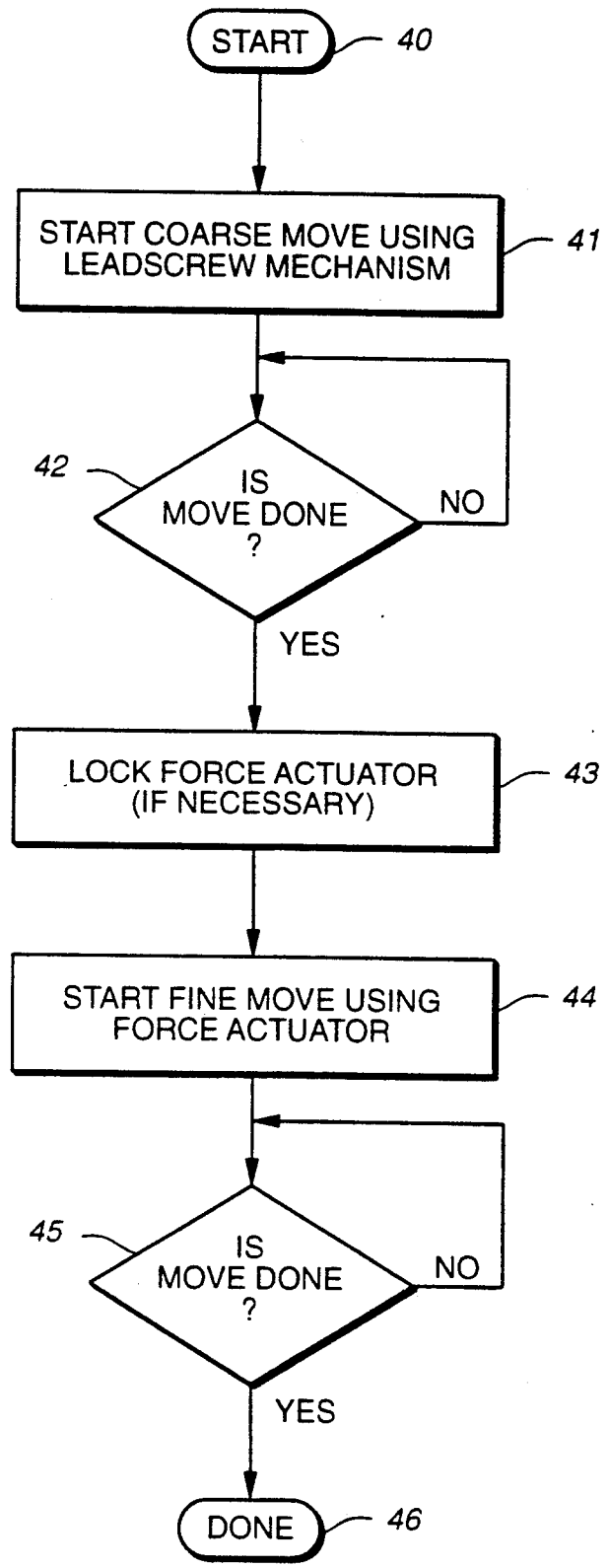
FIG._4

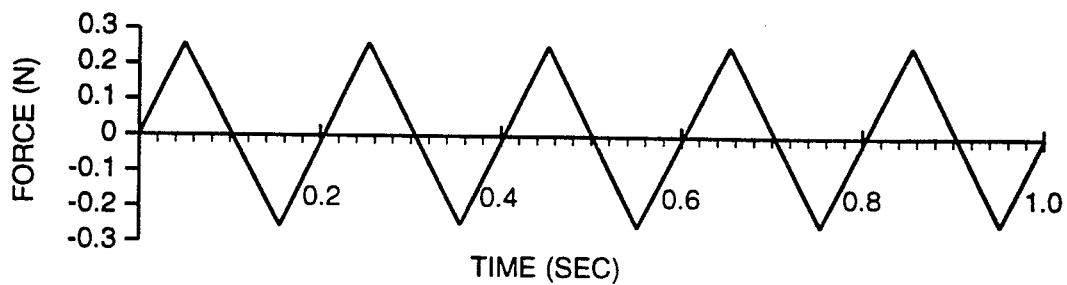
FIG._5A
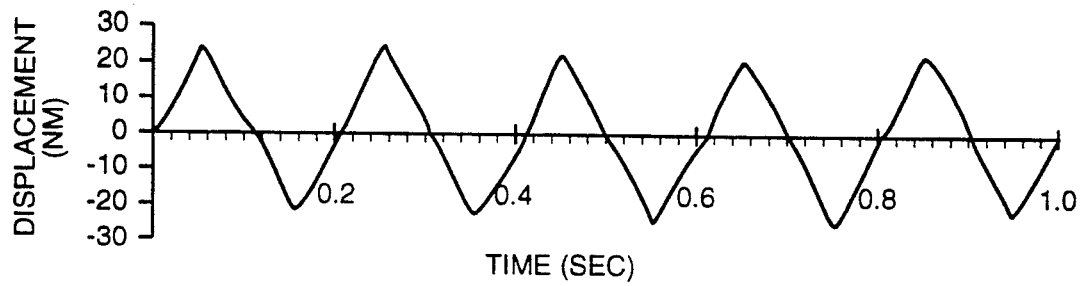
FIG._5B
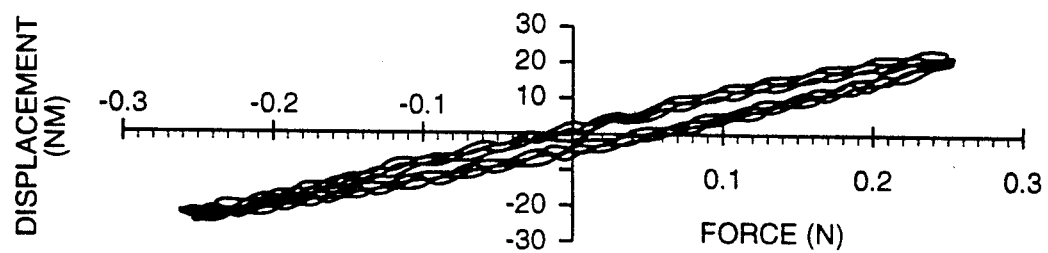
FIG._5C

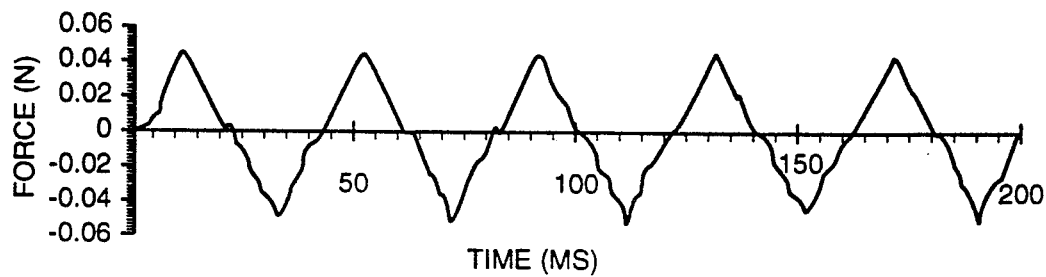
FIG._6A
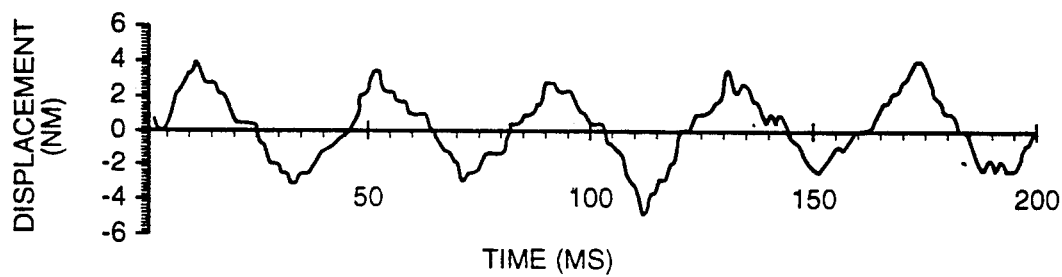
FIG._6B
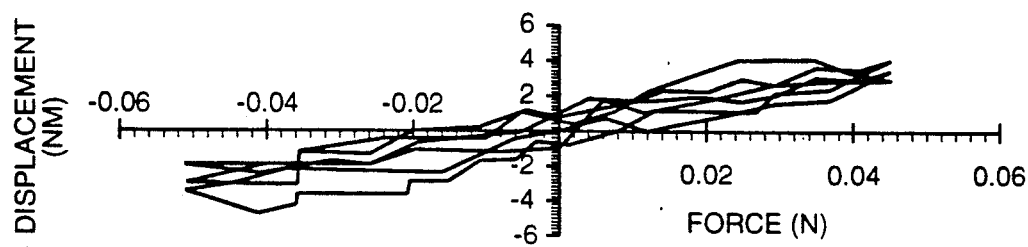
FIG._6C

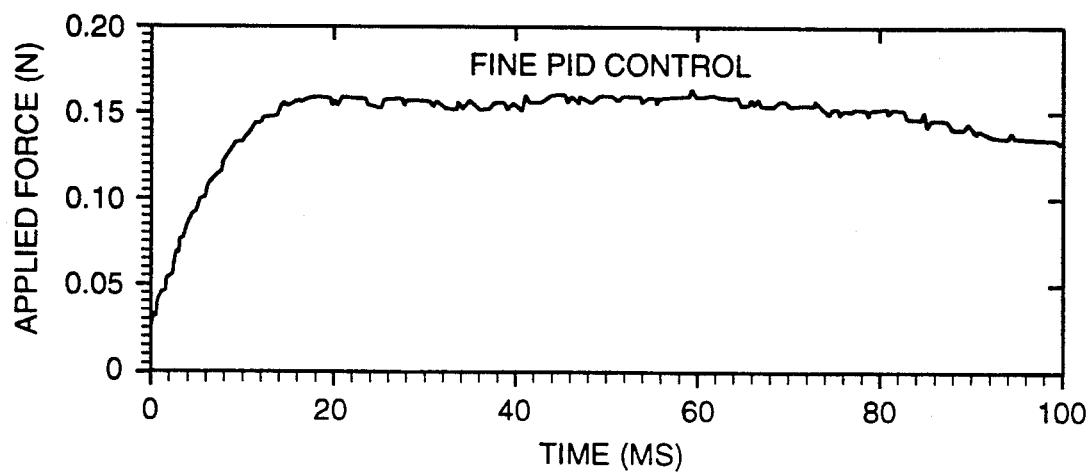
FIG._7A
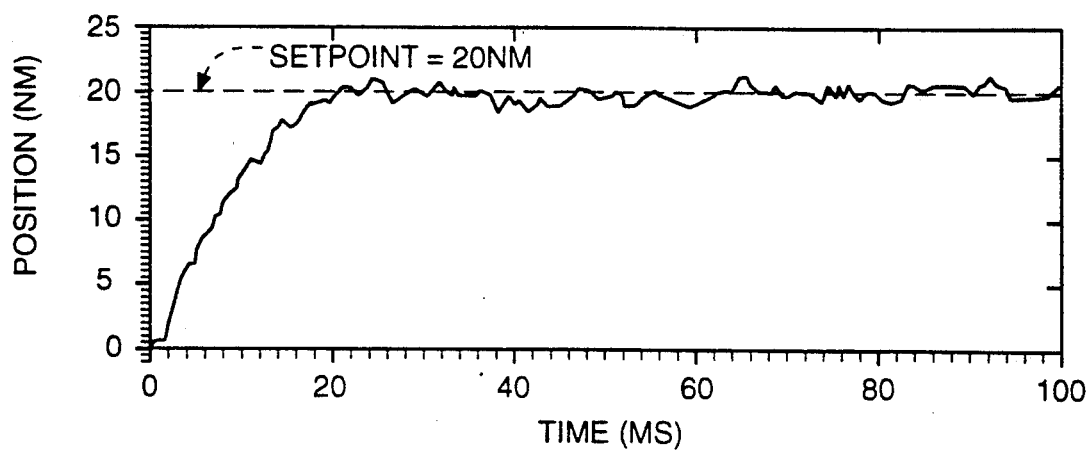
FIG._7B

APPARATUS FOR POSITIONING A STAGE

BACKGROUND OF THE INVENTION

The present invention relates generally to systems for positioning a first object relative to a second object and, more particularly, to an apparatus for precisely positioning a movable platform or stage along an axis of motion.

The need for positioning accuracy of a mechanical stage for both large (coarse) and small (fine) motion has been increasing with the progression of semiconductor manufacturing technology such as microlithography. Lithography involves various techniques for selectively removing or adding material to semiconductor wafers from which, for example, very large scale integrated (VLSI) circuit components may be fabricated.

Masked ion beam lithography, in which a collimated beam of ions passes through a mask onto a semiconductor wafer covered with photoresistive material, provides extremely high pattern resolution. However, because there is some ion scattering when the ions travel through the mask, the mask and wafer must be positioned very closely to each other to achieve high-pattern resolution exposures.

Additionally, once the mask is fixed in location, alignment of the wafer relative to the mask requires very precise motions. The motions may involve four and as many as six degrees of freedom. This movement needs to be accomplished very rapidly, and the wafer needs to be held rigidly in place once it is precisely located.

Step-and-repeat projection alignment and exposure systems are employed both in the fabrication of photomasks and in the processing of semiconductor wafers. A high (sub-micron) resolution photomask may be fabricated by using a precisely-controlled stage movable along coordinate axis of motion. The stage may successively position adjacent regions of the mask relative to an image (formed by a projection lens) of a reticle containing a level of microcircuitry that is to be printed on the photomask. An array of adjacent regions of microcircuitry of one level may be formed on the photomask in rows and columns parallel to the stage's coordinate axes of motion. A set of such masks, each bearing an array of microcircuitry of a different level, can be employed to fabricate integrated circuits from a semiconductor wafer.

The semiconductor wafer may be sequentially aligned with each photomask of the set, and a level of microcircuitry printed on the photomask may be, in turn, printed on the wafer. This can also be done by using a precisely-controlled stage movable along coordinate axis of motion to successively position adjacent regions of the wafer relative to the mask.

Additionally, the mask set fabrication operation may be eliminated; and instead, a precisely-controlled stage may be used to successively position adjacent regions of the wafer relative to each of the reticles employed in fabricating the photomasks. Thus, the level of microcircuitry contained on each those reticles may be printed directly onto the wafer during separate step-and-repeat printing operations.

The above-described operations require accurate measurement of microscopic objects whose sizes are in the range of 1 to 50 micrometers ($\mu m$). Displacement of these objects on the stage may be measured by an interferometer, an encoder, or a linear variable differential transformer. The stage must be capable of linearly positioning objects over the required range with resolutions of at least 0.001 $\mu m$ or less with a motion that is free as possible of vibration, pitch, roll, and yaw.

Micropositioning stages used heretofore have employed mechanical bearings and screws to permit the required movement of an object carried by the stage. Additionally, where movement of the object along two axial directions is required, stages have been stacked one on top of the other in a vertical arrangement. This procedure, while permitting biaxial orientation and displacement of the object, also results in undesirable deviation in accordance with the "Abbe" principle. See J.B. Bryan, "The Abbe Principle Revisited An Updated Interpretation", Lawrence Livermore Laboratory, May 14, 1979.

Other systems used heretofore for wafer lithography have incorporated a rotating stage on top of a translational stage. Translational motion of the wafer in a plane and rotation of the wafer about an axis normal to the plane are allowed. The plane of translational motion is commonly referred to as the x-y plane, and the angle of rotation in the x-y plane as $\theta$.

It is an object of the present invention to provide a very accurate and precise stage positioning apparatus for movement of an object.

Another object of the present invention is to provide a micropositioning device for movement of an object in two directions which avoids the "Abbe" deviation heretofore encountered in systems using multiple stacked stages.

It is a further object of the present invention to provide an inexpensive stage positioning apparatus for movement of an object over a wide dynamic range.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the claims.

SUMMARY OF THE INVENTION

The present invention is directed to a stage positioning apparatus. The apparatus comprises a stage supported on a bearing surface for movement of the stage relative to the bearing surface. The apparatus further includes a drive means for moving the stage relative the bearing surface in at least one direction over a first range of motion. Additionally, the apparatus includes an actuator means coupled to the stage for applying a linear force to the stage to move the stage in at least the one direction over a second range of motion. The second range of motion is less than the first range of motion. The actuator means may comprise a voice coil.

BRIEF DESCRIPTION OF THE DRAWINGS

The accompanying drawings, which are, incorporated herein and constitute a part of the speciricaton, schematically illustrate a preferred embodiment of the invention and, together with the general description given above and a detailed description of the preferred embodiment given below, serve to explain the principles of the invention.

FIG. 1 schematically illustrates a stage positioning apparatus of the present invention;

FIG. 2 schematically illustrates an embodiment of a voice coil actuator;

FIGS. 3A to 3C schematically illustrate arrangements for allowing the actuator to move with the stage during coarse positioning while allowing the actuator to be fixed during fine positioning;

FIG. 4 is flow diagram illustrating a control logic for fine motion control using parallel force actuation in accordance with the present invention;

FIGS. 5 and 6 graphically illustrate (b) the open-loop response of voice coil actuation when different sawtooth currents (a) are applied to a voice coil; and FIGS. 5(c) and 6(c) show stage displacement versus applied force; and FIGS. 7(a) and 7(b) graphically illustrate an applied force during positioning control and the closed-loop response of voice coil actuation, respectively, using conventional proportional, integral, differential (PID) control.

DESCRIPTION OF THE PREFERRED EMBODIMENTS

The present invention will be described in terms of a number of different embodiments. The preferred embodiment is an apparatus for providing coarse and fine positioning of an object positioned on a stage. The apparatus operates on a single stage and provides parallel, low impedance positioning. The positioning is parallel in the sense that both the fine and coarse actuators apply force to the same stage ("in parallel"). The fine positioning is low (mechanical) impedance in that the fine actuator only imposes small forces on the stage.

As will be discussed, the present invention provides very precise positioning over a wide range of motion by the use of a linear force actuator attached to a stage. The actuator uses the mechanical microelasticity of the stage to provide nanometer positioning accuracy.

The micropositioning apparatus, represented generally by reference number 10, shown in FIG. 1, can precisely position a stage 12, using a combination of fine and coarse positioning. As shown, stage 12 is movable relative to a bearing surface 14. The stage may be connected with the bearing surface by various sliding mechanisms, such as dovetail-type guides or rolling mechanisms, for example ball-bearings or roller-bearing systems. As illustrated, roller bearings 16 may connect stage 12 to bearing surface 14.

For coarse positioning, stage 12 may be driven by an electric motor 18. The motor 18 may rotate a lead screw 20 coupled to stage 12 by a nut 22.

During movement of the stage, rolling or sliding friction occurs both in the places of contact of the stage with the bearing surface, and in the drive means. Additionally, in the drive means, play may occur which effects the dynamic characteristics of the system, particularly when reversing directions. Due to the combined effects of play and friction, the movement of the stage at the moment of stopping, i.e. at velocities approximating zero, is non-uniform and jerky. This may reduce the accuracy of stopping to a value on the order of 0.1 to 0.5 $\mu$m. Thus, an object on the stage can only be positioned within about 0.1 to 0.5 $\mu$m of a reference point. This range of accuracy may be called a first range of motion over which coarse positioning may take place.

Due to the combination of friction between the stage and the bearing surface, and the degree of play inherent in the drive means, the stage possesses a certain mechanical elasticity, providing the stage in effect with a spring constant. This elasticity is only active over a very small range of motion. The present invention takes advantage of the mechanical elasticity of the stage to provide for stage positioning over a second range of motion, which is less than the first range of motion. As will be described, the present invention employs an actuator to produce a linear force to move the stage over the second range of motion.

As shown in FIGS. 1 and 2, the actuator, represented generally by reference number 25, may comprise a voice coil 24 and a magnet 26. As is well known in the art, magnet 26 is disposed within the windings of coil 24. The coil and magnet may be attached to a diaphragm 27. The coil moves through the gap between the pole pieces of the magnet due to the interaction of the fixed magnetic field with that associated with the AF current flowing through the coil. This, in turn, produces a linear, mechanical force which is applied to stage 12 at the contact interface between the stage and diaphragm 27.

Thus, as can be seen, actuator 25 can exert a small linear force directly on stage 12 for fine positioning. Because of the relatively large spring constant of the stage, nanometer order positioning can be achieved by adjusting the linear force over a small working range. More specifically, over the second range of motion, the stage 12 behaves like a spring as there is no measurable friction over that range. The apparatus of the present invention should also work if the stage is supported by means other than rollers, for example, by ball or needle bearings.

A laser interferometer measuring system may be provided for measuring stage movement. As shown in FIG. 1, a reflecting device, such as a plane mirror 28 or reflecting prism, is mounted on stage 12. The distance the stage moves may be determined by a remote laser interferometer 30. The measurement accuracy obtained with the laser interferometer technique is very great, provided that there is no unwanted movement of the constituent parts of the optical system.

A systems controller 32 may be employed to control fine and coarse positioning of the stage. More specifically, the controller controls the torque of drive motor 18 (for coarse positioning) through power amplifier 34. Stage 12 is moved by motor 18 until the position error, which equals to the actual stage position minus the required position, falls within the working range of linear actuator 25 (for fine positioning). At that time, controller 32 switches to control actuator 25 via power amplifier 36.

The actuator 25 must be free to move with movement of stage 12. After the stage is moved over a first range of motion, corresponding to coarse positioning of the stage, the stage is stopped. The actuator 25 may then be activated to move the stage over a second range of motion, corresponding to fine positioning of the stage. During this operation, the actuator can be at locked in place relative to a ground or support surface 14 (see FIG. 1). Additionally, during the fine positioning, the actuator must be activated at all times during the time an object on the stage is being maintained and positioned relative to some reference point and/or point of operation.

The actuator must thus be free to "float" or move with the stage during stage movement over the first (coarse) range of motion. However, over the second (fine) range of motion, the actuator must be locked into place relative to a ground or support surface. Various configurations may be employed for achieving this result.

As shown schematically in FIG. 3A, actuator 25 may include an electromagnetic clutch assembly 40 which can engage, for example, bearing surface 14 after stage 12 has been positioned within a first range of motion. That is, electromagnetic clutch assembly 40 would not engage bearing surface 14 when the stage 12 is moving over that first range of motion. However, for fine positioning, the electromagnetic clutch assembly would be activated to, in effect, ground actuator 25 to surface 14 to permit fine positioning over the second range of motion.

Alternatively, electromagnetic actuator assembly 40 may be eliminated, and the voice coil can be made as long as the overall permitted range of motion of the stage. As such, the actuator could "float" with the stage but would be grounded with the stage stops after coarse positioning.

Another arrangement for allowing the actuator to "float" relative to the stage is shown in FIG. 3B. Here, a pre-tensioned cable 42 is attached to opposite ends of stage 12 by means of pulleys or rollers 43 and 45. Tension is applied to cable 42 by rotation of a motor shaft 46 (the motor is not shown). During coarse positioning, the actuator moves or "floats" with stage 12 as cable 42 allows such motion. For fine positioning, motor shaft 46 is rotated to apply a tension to cable 42 to substantially fix the position of the stage, but allowing for movement of the stage over the second range of motion to permit fine positioning.

FIG. 3C illustrates a hydraulic system for permitting the actuator to "float" with the stage. Specifically, one end of a piston 47 of a piston-cylinder arrangement 48 is attached to the stage. An end of a cylinder 49 is secured to an appropriate ground or supporting surface 50. A control valve 51 is provided for applying pressure, either pneumatic or hydraulic, from a pressure source 52 to cylinder arrangement 48. During coarse positioning, valve 51 is open and piston 47 is free to move within cylinder 49. However, for fine positioning, valve 51 is closed and piston 47 is no longer free to move. The lock provided by this arrangement is relative as the stage is still free to move over the second range of motion in response to the application of a linear force by actuator 25.

FIG. 4 illustrates the control logic for operation of the present invention. As shown, stage 12 may be initially positioned within a first range of motion by starting the coarse movement, for example, the lead screw mechanism 20, 22 (see boxes 40–42). After the coarse adjustment has been completed, the linear force actuator is locked in place, if necessary (see box 43). Thereafter, an electrical signal is applied to the linear force actuator 25 to initiate the fine movement of the stage over the second range of motion, which is smaller than the first range of motion over which the coarse adjustment took place (see box 44). Thereafter, the stage is positioned by the linear actuator to the precise position required by the particular operation being conducted (see boxes 45 and 46).

The present invention has been employed with an x-y positioning table manufactured by Kensington Laboratories Inc., Richmond, California. The particular table employed was the Model 8500-8-8. This model incorporates x and y stage platforms, and an enclosed lead screw with sealed support bearings located in fixed precision line bores at each end of travel. The encoder used with this stage has an accuracy or resolution of approximately 0.5 $\mu$m. Thus, an object on the stage can be positioned within approximately 0.5 $\mu$m of a reference point.

To demonstrate the present invention, a linear actuator was coupled to one stage of the Kensington table and a sawtooth current was applied to the actuator to move the stage. FIGS. 5(b) and 6(b) show the open-loop response of voice coil actuation when the sawtooth currents of FIGS. 5(a) and 6(a) are applied to the voice coil. FIGS. 5(c) and 6(c) show stage displacement versus the applied force. As seen, stage displacement is quite linear and almost hysteresis free.

The spring constant of the stage can be calculated from the gradient of the curves shown in FIGS. 5(c) and 6(c). The spring constant was calculated to be about 1.0E7 Newton/meters. The resolution of the actuation is limited only by the measurement resolution. In the experiments described, a laser interferometer with approximately 5 nm (0.005 $\mu$m) resolution was added to the system. In addition, the analog signal from the encoder was amplified to give a resolution of 1 nm. Additional data fluctuation may be caused by external vibration noise. The actuator of the present invention is probably as precise as one nanometer, which should satisfy the requirements of the next generation of semiconductor lithography technology.

FIG. 7(b) shows the closed-loop response of voice coil actuation using conventional proportional, integral and differential (PID) control. FIG. 7(a) shows the applied force during the positioning control. Because of the linearity of the actuation as explained above, simple PID control works very well. The data obtained plus or minus one nanometer steady state error with 20 milliseconds setting time for a 20 nanometer move.

A stage of the Kensington table discussed above may be moved over a range of about 0.5 meters, and it can be positioned within plus or minus 0.1 to 0.5 $\mu$m of a reference line. The actuator of the present invention provides for fine positioning within plus or minus one nanometer of that line. The actuator thus provides a resolution of 1 nanometer. As such, the dynamic range of the apparatus of the present invention is on the order of $10^9$. This dynamic range is significantly larger than anything available heretofore for single stage devices.

The positioning system of the present invention provides high precision and stability. The stage position is relatively easy to control, and friction and backlash hysteresis are minimized. The system is also economical. As noted, it may use a conventional lead screw-driven stage structure, and the actuator itself is relatively inexpensive.

The present invention is very reliable, applying only very small forces and thus stresses to the stage. The linear actuator is also simpler and stronger than piezoelectric-type actuators used heretofore. The actuator is also small in size and light in weight.

The response time of fine actuation is only limited by the resonance frequency of the stage mass and the stage spring constant. If the resonant frequency is about 100Hz, the response time would be around 20 milliseconds.

The actuator may be used to axially position a stage in the x-y directions. It can also be used as an active vibration control system while the stage is moving or after the stage has finished a relatively long move. The actuator may possibly also be used for tilting a control stage.

The apparatus of the present invention may have various applications. For example, it may be used with a semiconductor wafer x-y stage, optical steppers, electron beam lithography systems, and x-ray lithography systems. The apparatus may also be used to position an x-y specimen stage in conventional microscopes, electron beam microscopes and scanning-tunnelling microscopes.

As noted, the apparatus of the present invention provides very precise positioning by attaching a linear force actuator to a lead-screw, for example, driven stage. The actuator makes use of the mechanical elasticity of the stage for fine positioning over a second range of motion. The lead screw is used to position the stage over a first range of motion, which, as discussed, is greater than the second range of motion.

Additionally, although a voice coil actuator has been described, it may be possible to use other types of actuators to apply a linear force to the stage. For example, a pneumatic actuator, a slide-sleeve structure, or a motor, pulley and cable arrangement may be used as the actuator.

The present invention has been described in terms of a number of embodiments. The invention, however, is not limited to the embodiments depicted and described. Rather, the scope of the invention is defined by the appended claims.

What is claimed is:

1. A stage positioning apparatus, comprising:
   a single stage movably supported on a bearing surface for movement of said stage relative to said bearing surface;
   a drive for applying a first force to said stage for moving and positioning said stage relative to said bearing surface in one direction over a first range of motion;
   an actuator coupled to said stage for applying a second force directly to said stage, and not through said drive, to move said stage in said one direction over a second range of motion, said second range of motion being less than said first range of motion; and
   wherein said drive applies the first force directly to said stage and not through said actuator.

2. The apparatus of claim 1 wherein said actuator comprises a magnet and voice coil means for applying a linear force of said stage.

3. The apparatus of claim 2 wherein said voice coil and magnet means includes a diaphragm affixed to said stage.

4. The apparatus of claim 1 further including means for releasably fixing the position of said stage within said first range of motion while permitting said stage to move over said second range of motion.

5. The apparatus of claim 1 further including a sensor for determining the position of said stage; and a controller for controlling said drive and said actuator to position said stage.

6. An apparatus for adjustment of stage position, comprising:
   a movable stage supported on a bearing surface by a bearing means, said stage possessing a degree of mechanical elasticity;
   drive means for applying a first force to said stage for moving and positioning said stage relative to said bearing surface in one direction over a first range of motion;
   means for producing a second force which is coupled to said stage directly and not through said drive means to act on the mechanical elasticity of said stage to move said stage in said one direction over a second range of motion, said second range of motion being less than said first range of motion; and
   wherein said drive means applies the first force directly to said stage and not through said means for producing said second force.

7. An apparatus for positioning a movable stage supported on a bearing surface, comprising:
   a drive means coupled to said stage for applying a first force thereto for moving and positioning said stage relative to said bearing surface in one direction over a first range of motion in response to selected electrical signals;
   a magnet and voice coil means for producing a second force which is applied directly to said stage and not through said drive means, in response to said electrical signals, to move said stage in said one direction over a second range of motion, said second range of motion being less than said first range of motion;
   a sensor means for determining the position of said stage;
   control means for controlling the operation of said drive means and said magnet and voice coil means, said control means generating said electrical signals; and
   wherein said drive means applies the first force directly to said stage and not through said magnet and voice coil means.

8. A system for positioning a stage relative to a bearing surface, wherein said stage is supported on said bearing surface, said system comprising:
   means for applying a first force to said stage for moving and positioning said stage relative to said bearing surface in one direction over a first range of motion, said stage having a degree of mechanical elasticity;
   an actuator for applying a second force which is coupled to said stage directly and not through said first force applying means to act on the mechanical elasticity of said stage to move said stage relative to said bearing surface in said one direction over a second range of motion, said second range of motion being less than said first range of motion; and
   wherein said first force applying means applies the first force directly said stage and not through said actuator.

9. The system of claim 8, wherein said actuator comprises a magnet and voice coil.

10. The system of claim 8, wherein said first force applying means comprises a drive.

11. The system of claim 10, wherein said actuator comprises a magnet and voice coil.

12. A method for positioning a stage supported on a bearing surface, comprising the steps of:
   applying a first force directly to said stage with a drive to move and position said stage relative to said bearing surface in one direction within a first range of motion; and
   while the first force is being applied, applying a second force directly to said stage with an actuator and not through said drive to adjust the position of said stage in said one direction within a second range of motion which is less than said first range of motion and said applying the first force directly to said stage and not through said actuator

* * * * *

UNITED STATES PATENT AND TRADEMARK OFFICE
CERTIFICATE OF CORRECTION

PATENT NO. : 5,323,012
DATED : June 21, 1994
INVENTOR(S) : David M. Auslander, et al.

It is certified that error appears in the above-indentified patent and that said Letters Patent is hereby corrected as shown below:

Column 1, line 37, replace "axis" with --axes--.
Column 1, line 60, after "each" insert --of--.
Column 2, line 2, after "is" insert --as--.
Column 2, line 48, after "relative" insert --to--.
Column 2, line 58, after "are" delete --,--.
Column 2, line 59, replace "specirication" with --specification--.
Column 4, line 44, delete "to".
Column 4, line 55, after "at" insert --a--.
Column 8, claim 12, last line, after "actuator" insert --.--.

Signed and Sealed this

Twenty-eight Day of February, 1995

Attest:

BRUCE LEHMAN

Attesting Officer     Commissioner of Patents and Trademarks